(12) United States Patent
Chung et al.

(10) Patent No.: US 12,515,244 B2
(45) Date of Patent: Jan. 6, 2026

(54) SELF-CLEANING DEVICE AND METHOD USING ELECTRICAL OSCILLATION AND MECHANICAL OSCILLATION

(71) Applicant: MICROSYSTEMS, INC., Daejeon (KR)

(72) Inventors: Sang Kug Chung, Yongin-si (KR); Kang Yong Lee, Yongin-si (KR); Jeong Min Lee, Yongin-si (KR); Dae Young Lee, Yongin-si (KR); Dae Geun Kim, Yongin-si (KR)

(73) Assignee: MICROSYSTEMS, INC., Daejeon (KR)

( * ) Notice: Subject to any disclaimer, the term of this patent is extended or adjusted under 35 U.S.C. 154(b) by 0 days.

(21) Appl. No.: 18/496,611

(22) Filed: Oct. 27, 2023

(65) Prior Publication Data

US 2024/0066565 A1 Feb. 29, 2024

Related U.S. Application Data

(63) Continuation of application No. 17/742,396, filed on May 12, 2022, now Pat. No. 11,833,556, which is a (Continued)

(30) Foreign Application Priority Data

Nov. 13, 2019 (KR) ........................ 10-2019-0144647

(51) Int. Cl.
*B08B 13/00* (2006.01)
*B08B 7/02* (2006.01)
(Continued)

(52) U.S. Cl.
CPC .............. *B08B 7/026* (2013.01); *B08B 11/04* (2013.01); *B08B 13/00* (2013.01); *B60S 1/02* (2013.01)

(58) Field of Classification Search
None
See application file for complete search history.

(56) References Cited

U.S. PATENT DOCUMENTS

2013/0298419 A1 11/2013 Trevett et al.

FOREIGN PATENT DOCUMENTS

| JP | 2019-508301 A | 3/2019 |
| KR | 10-2010-0035691 A | 4/2010 |

(Continued)

OTHER PUBLICATIONS

Google Patents translation of JP2019508301A (Year: 2023).*
(Continued)

*Primary Examiner* — Eric W Golightly

(57) ABSTRACT

A self-cleaning device comprises at least one first electrode disposed on a solid material layer, a first dielectric layer disposed on the first electrode, a hydrophobic layer disposed on the first dielectric layer, and at least one mechanical oscillation unit. Electrical oscillation for oscillating a droplet in a horizontal direction is generated by applying a first electric signal to the first electrode, thereby merging droplets formed on the hydrophobic layer, the mechanical oscillation unit moves the merged droplets in a specific direction or atomizes the merged droplets to remove the merged droplets by generating mechanical oscillation for oscillating the droplet in a vertical direction, and each of the droplets has a volume smaller than 3 µl, and new droplet having a volume more than 3 µl is generated by the merging.

5 Claims, 11 Drawing Sheets

Related U.S. Application Data continuation of application No. PCT/KR2020/012974, filed on Sep. 24, 2020.

(51) Int. Cl.
  *B08B 11/04* (2006.01)
  *B60S 1/02* (2006.01)

(56) References Cited

FOREIGN PATENT DOCUMENTS

| | | |
|---|---|---|
| KR | 10-20180105056 A | 9/2018 |
| KR | 10-2019-0007779 A | 1/2019 |

OTHER PUBLICATIONS

Google Patents translation of KR20100035691A (Year: 2023).*
Google Patents translation of KR20180105056A (Year: 2023).*
Google Patents translation of KR20190007779A (Year: 2023).*
International Search Report of PCT/KR2020/012974, dated Feb. 15, 2021, 2 pages.
Written Opinion of the International Searching Authority of PCT/KR2020/012974, dated Feb. 15, 2021, 5 pages.

* cited by examiner

SELF-CLEANING DEVICE AND METHOD USING ELECTRICAL OSCILLATION AND MECHANICAL OSCILLATION

CROSS-REFERENCE TO RELATED APPLICATIONS

This application is a continuation of U.S. application Ser. No. 17/742,396 filed on May 12, 2022, and issued as U.S. Pat. No. 11,833,556 on Dec. 5, 2023, which is a continuation of pending PCT International Application No. PCT/KR2020/012974, which was filed on Sep. 24, 2020, and which claims priority from and the benefit of Korean Patent Application 10-2019-0144647, filed with the Korean Intellectual Property Office on Nov. 13, 2019, the disclosure of which are hereby incorporated by reference in its entirety.

TECHNICAL FIELD

The present disclosure relates to a self-cleaning device and method using electrical oscillation and mechanical oscillation.

BACKGROUND ART

Recently, a head-up display HUD technique for displaying various driving information on a windshield of a vehicle and a technique of replacing the windshield with a transparent display have been developed according to electrification of the vehicle and the spread of a smart car.

Accordingly, it is important to develop a cleaning technique for removing efficiently foreign substance such as rainwater or dust on the windshield or the transparent display.

Most of vehicles remove usually foreign substance by using a wiper at present. However, the wiper moves repeatedly on the windshield when it is driving, and thus the wiper interrupts continuously driver's view and can remove foreign substance only in an arc shape of a restricted area. Additionally, if the wiper is worn out, friction noise occurs and removal ability of the foreign substance reduces, and so it should exchange regularly the wiper.

Furthermore, devices such as a camera, etc. are exposed at external environment. Accordingly, rainwater is attached on a surface of the camera when it is raining. In this case, performance of the camera is considerably deteriorated because the camera does not include a function of removing the rainwater.

Moreover, droplets formed on a surface of a lens must be immediately removed so as to keep cleanly view of mini camera. If the cleaning device is continuously driven to remove the droplets, unnecessary power consumption occurs and lifetime of a cleaning device reduces.

SUMMARY

The present disclosure is to provide self-cleaning device and method using electrical oscillation and mechanical oscillation.

A self-cleaning device according to an embodiment of the disclosure includes at least one first electrode disposed on a solid material layer; a first dielectric layer disposed on the first electrode; a hydrophobic layer disposed on the first dielectric layer; and at least one mechanical oscillation unit. Here, electrical oscillation for oscillating a droplet in a horizontal direction is generated by applying a first electric signal to the first electrode, thereby merging the droplets formed on the hydrophobic layer, and the mechanical oscillation unit moves the merged droplets in a specific direction or atomizes the merged droplets to remove the merged droplets by generating mechanical oscillation for oscillating the droplet in a vertical direction.

A self-cleaning device according to another embodiment of the present disclosure includes at least one electrode disposed on a solid material layer; a dielectric layer disposed on the electrode; a hydrophobic layer disposed on the dielectric layer; at least one mechanical oscillation unit; and a controller. Here, electrical oscillation is generated to a droplet formed on the hydrophobic layer according as an electric signal is applied to the electrode, the mechanical oscillation unit oscillates the droplet by generating mechanical oscillation, and the controller controls to generate selectively the electrical oscillation or the mechanical oscillation according to situation of the droplet formed on the hydrophobic layer.

A self-cleaning method according to an embodiment of the present disclosure includes generating electrical oscillation to droplets formed on a surface of a self-cleaning device by applying an electric signal to an electrode, thereby merging the droplets to generate a new droplet; and moving or atomizing the generated new droplet to remove the new droplet by providing mechanical oscillation to the new droplet.

Self-cleaning device and method of the present disclosure generate a larger volume of new droplet by merging droplets by using electrical oscillation, and move the generated new droplet outside the self-cleaning device or atomize the generated new droplet, thereby removing the generated new droplet. As a result, removal efficiency of droplet may be enhanced. Specially, the self-cleaning device may remove pollutant such as conductive droplet, nonconductive droplet, dust and frost.

BRIEF DESCRIPTION OF DRAWINGS

Example embodiments of the present disclosure will become better apparent by describing in detail example embodiments of the present disclosure with reference to the accompanying drawings, in which.

DETAILED DESCRIPTION

Figure 1:
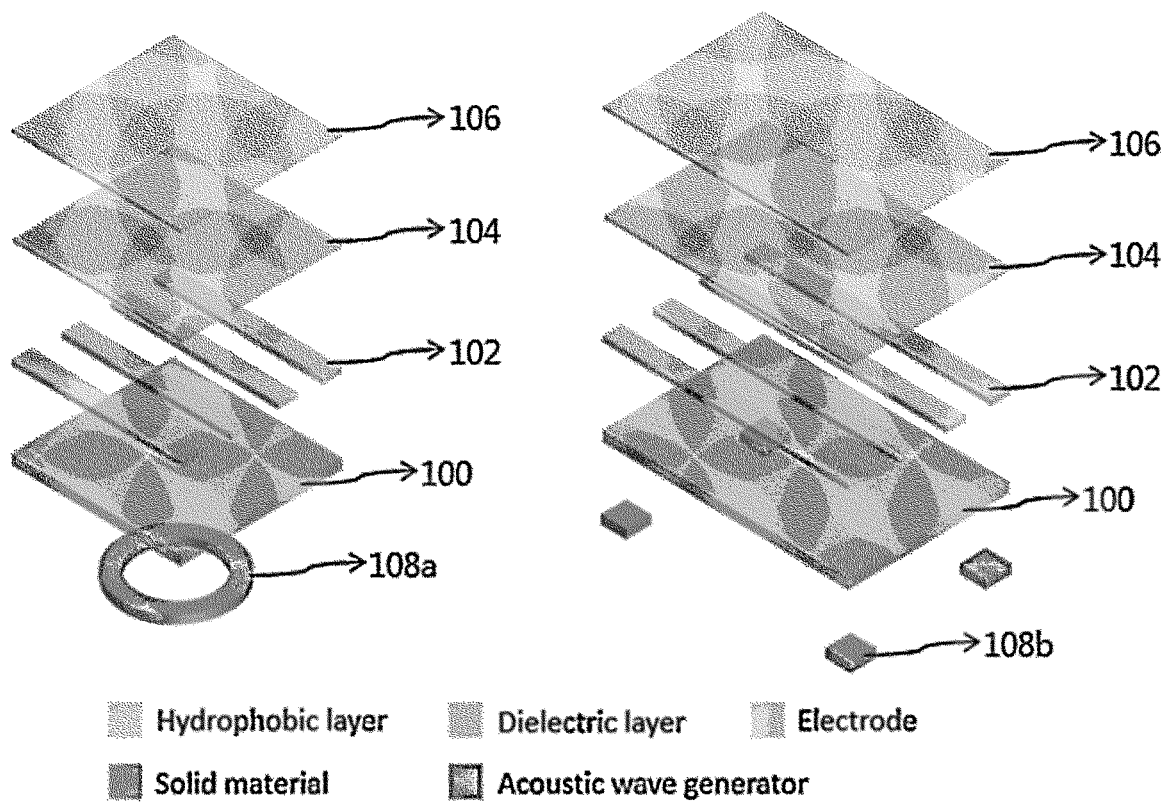
FIG. 1 is a view illustrating decomposition structure of a self-cleaning device according to a first embodiment of the present disclosure.

In the present specification, an expression used in the singular encompasses the expression of the plural, unless it has a clearly different meaning in the context. In the present specification, terms such as "comprising" or "including," etc., should not be interpreted as meaning that all of the elements or operations are necessarily included. That is, some of the elements or operations may not be included, while other additional elements or operations may be further included. Also, terms such as "unit," "module," etc., as used in the present specification may refer to a part for processing at least one function or action and may be implemented as hardware, software, or a combination of hardware and software.

The present disclosure relates to self cleaning device and method of self-removing a droplet such as rainwater and fog, dust, frost, etc. The self-cleaning device may be a single device or a device combined with another object.

In an embodiment, the self-cleaning device may efficiently remove the droplet such as the rainwater attached on its surface by using electrical oscillation and mechanical oscillation.

The droplet is removed after moved due to characteristics of a hydrophobic surface when its volume is more than 10 μl, whereas it should remove the droplet by oscillating the droplet because the droplet does not move naturally when the volume of the droplet is smaller than 10 μl.

Mechanical oscillation for oscillating the droplet in a vertical direction can remove the droplet having a volume of 3 μl to 10 μl, but it is difficult to remove the droplet with a volume smaller than 3 μl. However, removal efficiency of the droplet when the mechanical oscillation is used is excellent because the mechanical oscillation can atomize the droplet with strong oscillation.

Electrical oscillation for oscillating the droplet in a horizontal direction can remove droplets having a volume smaller than 3 μl as well as the droplets having a volume more than 3 μl. However, removal efficiency of the droplet when the electrical oscillation is used is lower than that when the mechanical oscillation is used.

Accordingly, the self-cleaning device of the present disclosure may use together the electrical oscillation and the mechanical oscillation to remove the droplets with high efficiency irrespective of the volume of the droplet. Of course, the self-cleaning device may use situationally one of the electrical oscillation and the mechanical oscillation or both of the electrical oscillation and the mechanical oscillation.

In an embodiment, the self-cleaning device may generate new droplet of above 3 μl by merging droplets by using the electrical oscillation for oscillating the droplets in the horizontal direction and remove the generated new droplet by using the mechanical oscillation, when the droplets having a volume smaller than 3 μl, e.g. small volume of rainwaters are attached on a surface of the self-cleaning device. That is, the self-cleaning device may merge the droplets by using the electrical oscillation and then remove the merged droplets by using the mechanical oscillation.

On the other hand, the self-cleaning device may be used to a device including an external glass, e.g., a camera of a vehicle, a digital camera, a mobile camera, an optical sensor for Internet of Things IoT, a mirror, a glass for building and so on.

Additionally, the self-cleaning device may be used to a windshield of the vehicle. Of course, the self-cleaning device may not be limited as usage to the camera or the windshield of the vehicle as long as it can remove the droplets and may be employed to various devices.

Hereinafter, embodiments of the present disclosure will be described in detail with reference to accompanying drawings.

Figure 2:
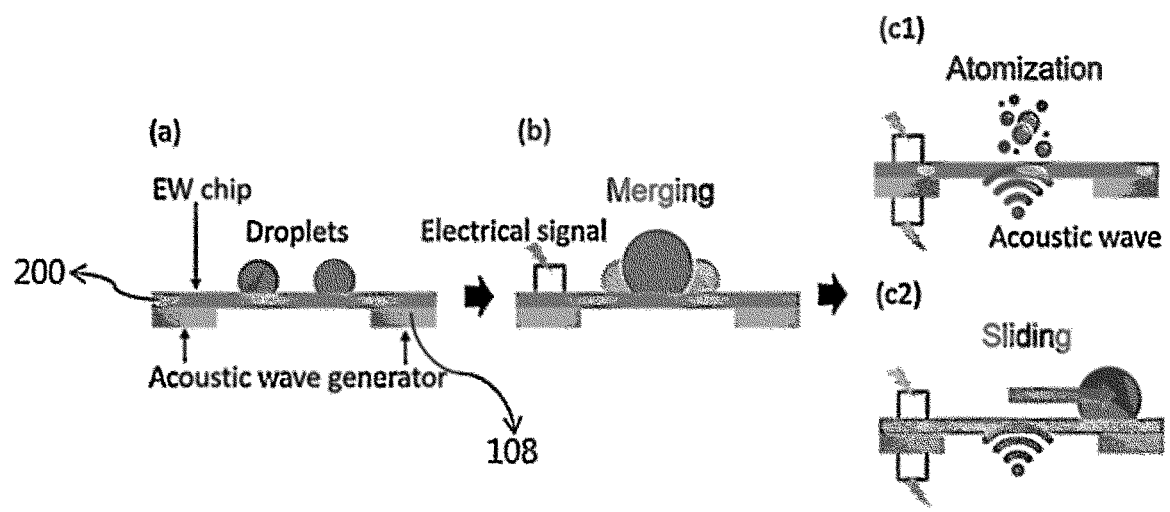
FIG. 2 is a view illustrating moving of a droplet when electrical oscillation or mechanical oscillation is used.
Figure 3:
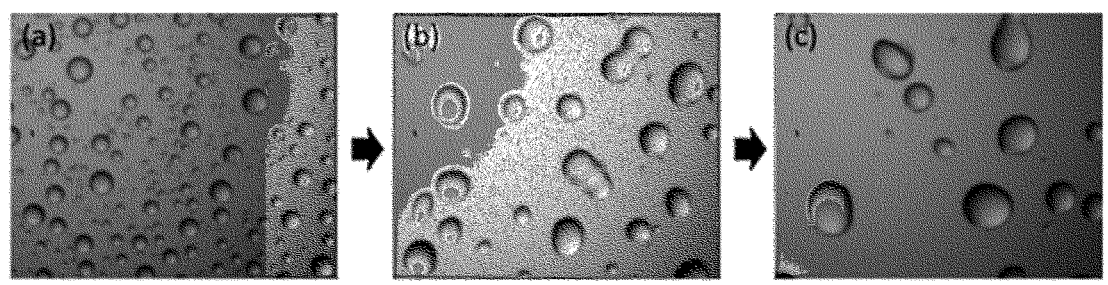
FIG. 3 is a view illustrating change of the droplet when the electrical oscillation is used according to an embodiment of the present disclosure.
Figure 4:
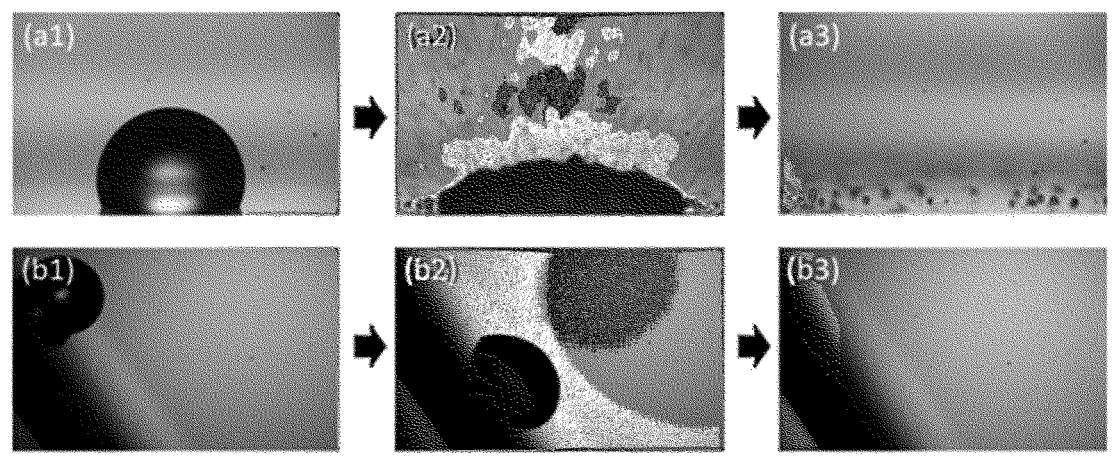
FIG. 4 is a view illustrating change of the droplet when the mechanical oscillation is used.
Figure 5:
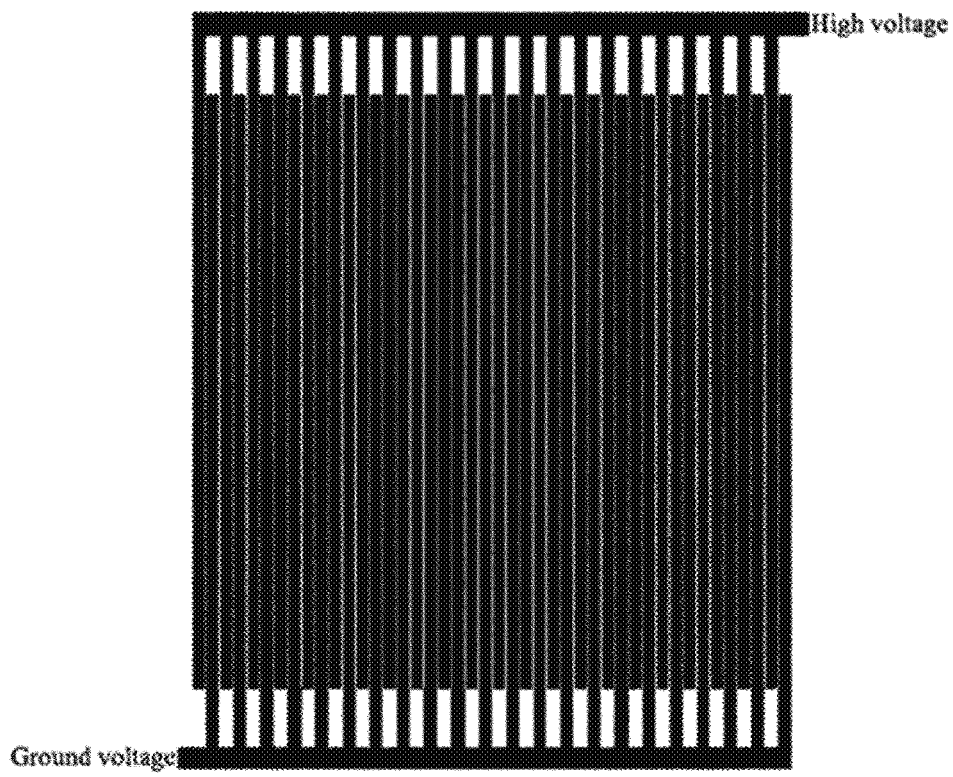
FIG. 5 is a view illustrating pattern of electrodes according to an embodiment of the present disclosure.

FIG. 1 is a view illustrating decomposition structure of a self-cleaning device according to a first embodiment of the present disclosure, and FIG. 2 is a view illustrating moving of a droplet when electrical oscillation or mechanical oscillation is used. FIG. 3 is a view illustrating change of the droplet when the electrical oscillation is used according to an embodiment of the present disclosure, and FIG. 4 is a view illustrating change of the droplet when the mechanical oscillation is used. FIG. 5 is a view illustrating pattern of electrodes according to an embodiment of the present disclosure.

The self-cleaning device of the present embodiment removes droplets by using the electrical oscillation or the mechanical oscillation.

In an embodiment, an alternating current voltage with a low frequency less than several hundred Hz, e.g., 50 Hz may be applied to electrodes 102 to generate the electrical oscillation. In this case, the droplet attached to a surface of the self-cleaning device oscillates according as an area of the droplet attached to the surface is continuously changed, and thus adhesive power between the droplet and the self-cleaning device has reduced continuously. As a result, the droplet is removed after be moved. Specially, this oscillation may remove the droplet with a volume smaller than 20 μl as well as the droplet of above 20 μl and remove really femto-liters of droplet. The volume of the rainwater, etc., is smaller than 20 μl.

The droplet spreads out considerably in a longitudinal direction when a high frequency (for example, a frequency of above 10 kHz) of a voltage is applied to the electrodes 102, and so it is difficult to remove the droplet because the droplet does not rarely move. Accordingly, the droplet does not move in a direction of gravity if a solid material layer is not inclined in high angle and only the droplet of above 20 μl may be removed after slipped. That is, it is impossible to remove the droplet in real when the high frequency of voltage is applied.

In an embodiment, a sound wave generator may be used for the mechanical oscillation. Resonance oscillation is generated at a specific frequency when the sound wave generator is used, and the droplet attached to the surface of the self-cleaning device may move or be atomized by the oscillation. Of course, the mechanical oscillation is not limited as the sound wave generator as long as the oscillation is generated by a mechanical method.

In FIG. 1, the self-cleaning device of the present embodiment is a device using the electrical oscillation and/or the mechanical oscillation, and it may include a solid material layer 100, at least one electrode 102, a dielectric layer 104, a hydrophobic layer 106 and a mechanical oscillation unit 108. Additionally, the self-cleaning device may further include a controller or a processor (not shown in FIG. 1) for controlling selectively the electrical oscillation or the mechanical oscillation.

In an embodiment, the solid material layer 100, at least one electrode 102, the dielectric layer 104 and the hydrophobic layer 106 may be disposed in sequence, the mechanical oscillation unit 108 may locate below the solid material layer 100, and the droplet such as rainwater may be adhered to the hydrophobic layer 106. That is, the hydrophobic layer 106 is exposed outside and thus the droplet is adhered to the hydrophobic layer 106.

The solid material layer 100 is a base layer, e.g., a substrate.

The electrode 102 is disposed on the solid material layer 100 as a transparent electrode, and the electrodes 102 may form a specific pattern. For example, the electrodes 102 may form comb-pattern as shown in FIG. 5.

The dielectric layer 104 is disposed on the electrode 102 and may contain one type or more of material selected from a group including parylene C, teflon, and metal oxides.

The hydrophobic layer 106 is disposed on the dielectric layer 104 and may be made up of a fluid such as water and material with low hydrophilicity. As a result, the droplet may move easily on a surface of the hydrophobic layer 106.

In an embodiment, the hydrophobic layer 106 may comprise a fluorinated material (including fluorine compound containing fluorine atom) having water repellency, oil repellency and chemical resistance property and a silane material (including organic/inorganic silane compound) for aiding compounding of organic material and inorganic material.

The hydrophobic layer 106 may have water repellency, oil repellency and chemical resistance property, and it may have stronger durability than the hydrophobic layer composed of fluorinated material.

The hydrophobic layer 106 may have adequate durability though it has thin thickness, e.g. several dozen nm because it has strong durability. The hydrophobic layer 106 may have excellent light transmission when it has thin thickness, thereby assuring adequately viewing angle of a glass of a vehicle or lens of a camera with removing easily droplets.

In an embodiment, the fluorine compound may contain fluorine atom of 49 at % or better on its surface so that the surface is in hydrophobic characteristics. The fluorine compound may be a polymer having chemical formula of —CxFy-, CxFyHz-, —CxFyCzHp-, —CxFyO—, —CxFyN (H)— (each of x, y, z, p is natural integer) and so on, or amorphous fluorine compound, e.g. AF1600. Here, the surface of the hydrophobic layer 106 may mean a thin layer corresponding to a distance of 50 angstrom to 100 angstrom from an upper surface in downward.

In an embodiment, the organic/inorganic silane compound may have one or better of amino group, vinyl group, epoxy group, alcoxyle, halogen, mercapto group, sulfide group, etc. Particularly, the organic/inorganic silane compound may be selected from a group including aminopropyltriethoxysilane, aminopropyl trimethoxysilane, aminomethoxy silane, penylaminopropyltrimethoxysilane, N-2-aminoethyl-3-aminopropyltrimethoxysilane, N-β-aminoethyl-γ-aminopropylmethyl dimethoxysilane, γ-aminopropyltrimethoxysilane, γ-aminopropyldimethoxysilane, γ-aminopropyltriethoxysilane, γ-aminopropyldiethoxysilane, vinyltriethoxysilane, vinyltrimethoxysilane, vinyltrimethoxyethoxysilane, di-, tri- or tetraalkoxysilane, vinylmethoxysilane, vinyltrimethoxysilane, vinylethoxysilane, vinyltriepoxysilane, 3-glycidoxypropyltrimethoxysilane, 3-methacryloyloxypropyltrimethoxysilane, γ-glycidoxypropyltriethoxysilane, γ-methacryloyloxypropyltrimethoxysilane, chlorotrimethylsilane, trichloro-ethylsilane, trichloro-methylsilane, trichlorophenylsilane, trichlorovinylsilane, mercaptopropyltriethoxysilane, trifluoropropyltrimethoxysilane, bistrimethoxysilylpropylamine, bis3-triethoxysilylpropyltetrasulfide, bistriethoxysilylpropyldisulfide, methacryloyloxypropyltrimethoxysilane, 2-3,4-epoxycyclohexylethyltrimethoxysilane, 3-glycidoxypropylmethyldiethoxysilane, 3-glycidoxypropyldiethoxysilane, 3-glycidoxypropyltriethoxysilane and p-styryltrimethoxysilane, and these compound. It is desirable that the organic/inorganic silane compound may be aminopropyltriethoxysilane or compound including the ammopropyltriethoxysilane.

The mechanical oscillation unit 108 generates the mechanical oscillation and may be for example a sound/acoustic wave generator for generating single sound wave or multiple sound waves. A mechanical oscillation unit 108a having a doughnut shape may locate under the solid material layer 100, or plural mechanical oscillation units 108b may locate under the solid material layer 100. That is, a size, a shape or a number of the mechanical oscillation unit 108 is not limited as long as the mechanical oscillation unit 108 generates the mechanical oscillation.

Hereinafter, a droplet removal operation of the self-cleaning device will be described in detail. The solid material layer 100, the electrode 102, the dielectric layer 104 and the hydrophobic layer 106 may be included in a chip 200 as shown in (a) of FIG. 2.

In an embodiment, the self-cleaning device may oscillate the droplets by applying an electrical signal, for example an alternating current voltage to the electrode 102. Hence, adhesive power of the droplets reduces, and so the droplets may be merged after be moved as shown in (b) of FIG. 2 and in (a)-(c) of FIG. 3. As a result, a droplet generated by the merging of the droplets may have a volume of above 3 μl though the droplets having a volume smaller than 3 μl is attached to the surface of the self-cleaning device. That is, micro droplets are changed to a droplet with a volume atomizable by the mechanical oscillation according as they are merged. In this case, the mechanical oscillation unit 108 is not activated.

Subsequently, the self-cleaning device stops the electrical oscillation and then generates the mechanical oscillation. In this case, the merged droplets may be removed by sliding as shown in (c2) of FIG. 2 and (b1)-(b3) of FIG. 4, or they may be atomized as shown in (c1) of FIG. 2 and (a1)-(a3) in FIG. 4. The atomization may be achieved when the volume of the droplet corresponds to a resonance frequency of a sound/ acoustic wave generated from the mechanical oscillation unit 108. This atomization may remove pollutant formed on the surface of the self-cleaning device as well as the droplet.

That is, the self-cleaning device may generate the new droplet having the volume and atomize by the mechanical oscillation by merging the droplets by using the electrical oscillation, and then it may remove the generated new droplet by using the mechanical oscillation. Of course, droplets not merged may exist, and these droplets may be also moved or atomized to be removed by the electrical oscillation and the mechanical oscillation.

Briefly, the self-cleaning device may remove rapidly and efficiently the droplets by using the electrical oscillation and the mechanical oscillation, irrespective of the volume of the droplet.

In another embodiment, the self-cleaning device may use selectively the electrical oscillation or the mechanical oscillation according to situation.

For example, the self-cleaning device may sense a type, a volume or a shape of the droplet by using a sensing unit (for example a camera) and use selectively the electrical oscillation or the mechanical oscillation according to the sensed result.

For example, the self-cleaning device may sense that most of rainwater has a volume of above 3 μl when the rain is falling in large drops and generate only mechanical oscillation without the electrical oscillation in response to the sensed result.

For another example, the self-cleaning device may sense that most of rainwater has a volume smaller than 3 μl when the rain is falling in small drops and generate only electrical oscillation without the mechanical oscillation in response to the sensed result.

In still another embodiment, the self-cleaning device may generate simultaneously the electrical oscillation and the mechanical oscillation. For example, the self-cleaning device may generate simultaneously the electrical oscillation and the mechanical oscillation for rapid removal of the droplets.

In still another embodiment, the self-cleaning device may merge the droplets by generating the electrical oscillation and then generate the mechanical oscillation for only its partial area by operating a part of mechanical oscillation units 108b when it uses multiple mechanical oscillation units 108b. This method may be performed when the droplet is attached to only partial area of the self-cleaning device.

Shortly, the self-cleaning device of the present embodiment may use the electrical oscillation for oscillating the droplet in the horizontal direction and the mechanical oscillation for oscillating the droplet in the vertical direction and use selectively the electrical oscillation or the mechanical oscillation according to situation. As a result, the droplets and the pollutant may be efficiently removed. Specially, strong shearing force generated by fast moving of the droplets at a triple phase boundary and flowing of the droplets may remove every type of liquid or solid pollutant attached to the surface of the self-cleaning device, while the mechanical oscillation and the electrical oscillation is being applied.

A frequency is not mentioned above, but a frequency for the electrical oscillation is different from that for the mechanical oscillation according to situation.

For example, a frequency for the mechanical oscillation when the mechanical oscillation generates after the electrical oscillation generates may be different from that when the electrical oscillation and the mechanical oscillation generate simultaneously.

Additionally, a shape and a number of the mechanical oscillation unit 108 may depend on a type, a size or a shape of the droplet to be removed, or the mechanical oscillation unit 108 may generate single sound wave or multiple sound waves according to object.

Furthermore, intensity of the electrical oscillation or the mechanical oscillation may be varied depending on time.

Hereinafter, the electrical oscillation will be described in more detailed.

Figure 6:
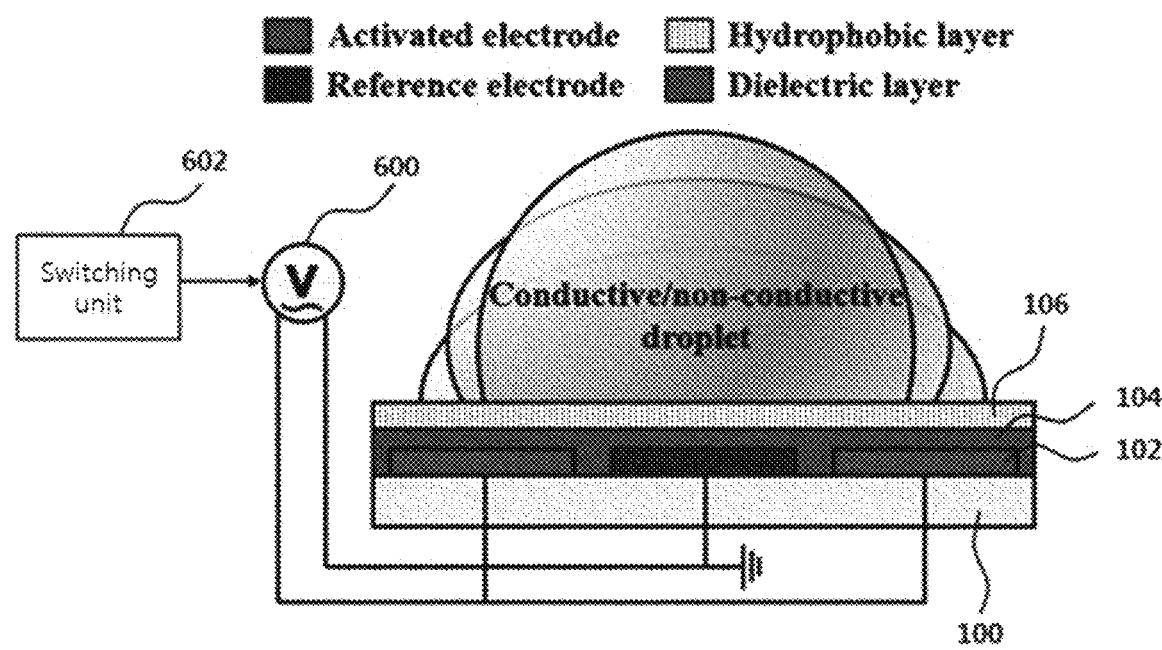
FIG. 6 is a view illustrating schematically constitution of a self-cleaning device according to another embodiment of the present disclosure.
Figure 7:
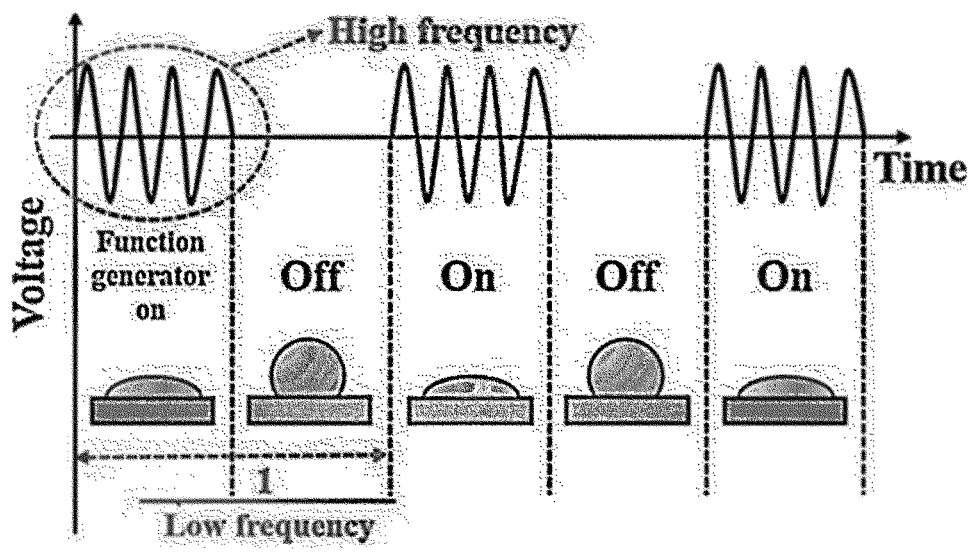
FIG. 7 and FIG. 8 are views illustrating operation of the self-cleaning device according to an embodiment of the present disclosure.
Figure 8:
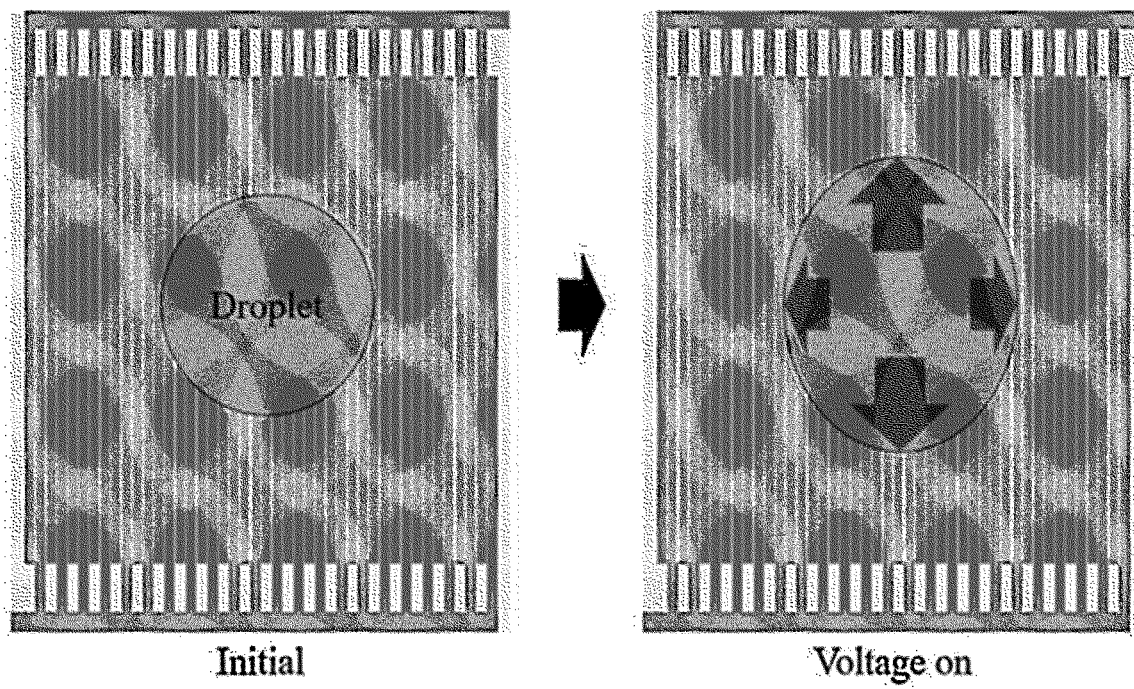

FIG. 6 is a view illustrating schematically constitution of a self-cleaning device according to another embodiment of the present disclosure, and FIG. 7 and FIG. 8 are views illustrating operation of the self-cleaning device according to an embodiment of the present disclosure.

In FIG. 6, the self-cleaning device of the present embodiment may include a solid material layer 100, an electrode 102, a dielectric layer 104, a hydrophobic layer 106, a voltage applying unit 600 and a switching unit 602.

The voltage applying unit 600 applies a high frequency alternating current voltage based on a reference frequency preset to the electrodes 102.

The switching unit 602 switches on/off the high-frequency alternating current voltage as shown in FIG. 7, thereby generating the high frequency alternating current voltages and a low frequency alternating voltage in one period. In this case, conductive droplet and nonconductive droplet attached to the surface of the hydrophobic layer 106 may be removed.

Particularly, the conductive droplet oscillates by the principle of electrowetting-on-dielectric when the low-frequency alternating current voltage is applied to the electrodes 102, thereby changing a contact angle between the conductive droplet and the hydrophobic layer 106. The nonconductive droplet oscillates by the principle of dielectrophoresis (DEP) when the high-frequency alternating current voltage is applied to the electrodes 102, thereby changing a contact angle between the nonconductive droplet and the hydrophobic layer 106. An adhesive power between the droplets and the hydrophobic layer 106 reduces by the oscillation, and so the droplets are moved by gravity to be removed.

A contact angle in a moving direction of the droplet is different from that in a direction opposite to the moving direction when the hydrophobic layer 106 is inclined by a certain angle, and thus the droplet is more efficiently slipped by difference of the contact angles.

The contact angle variation between the droplet and the hydrophobic layer 106 increases in a direction of the orientation of the electrode 102 as shown in FIG. 8. Accordingly, the droplet may be more efficiently removed when the direction of the orientation of the electrode 102 is a direction of gravity.

The self-cleaning device may generate the mechanical oscillation after applying the high frequency alternating current voltage using the switching method. In this case, the self-cleaning device may merge the conductive droplets and the nonconductive droplets and remove the merged droplets by using the mechanical oscillation.

Figure 9:
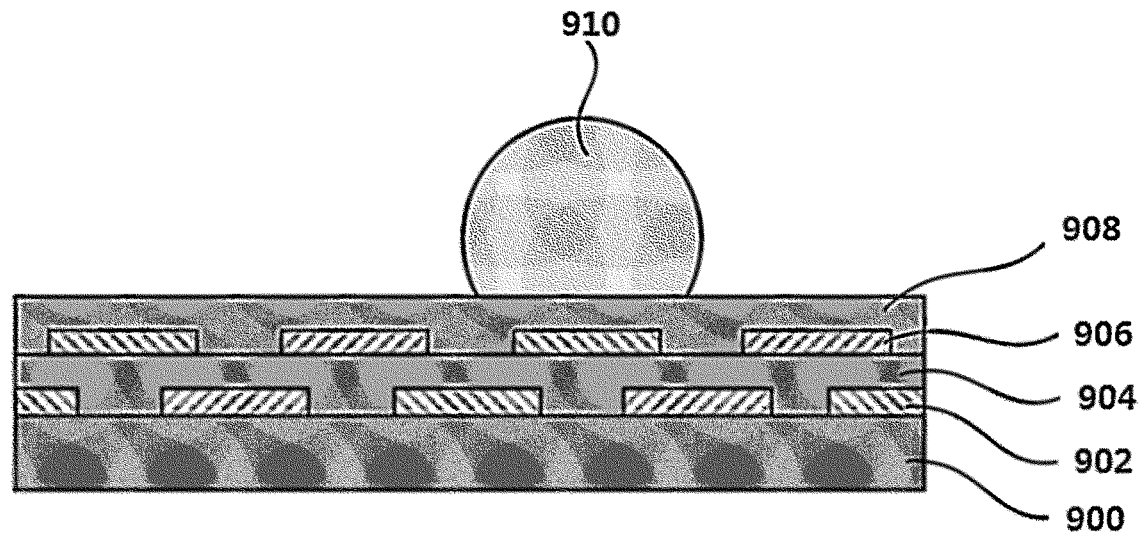
FIG. 9 is a sectional view illustrating a self-cleaning device according to a second embodiment of the present disclosure.
Figure 10:
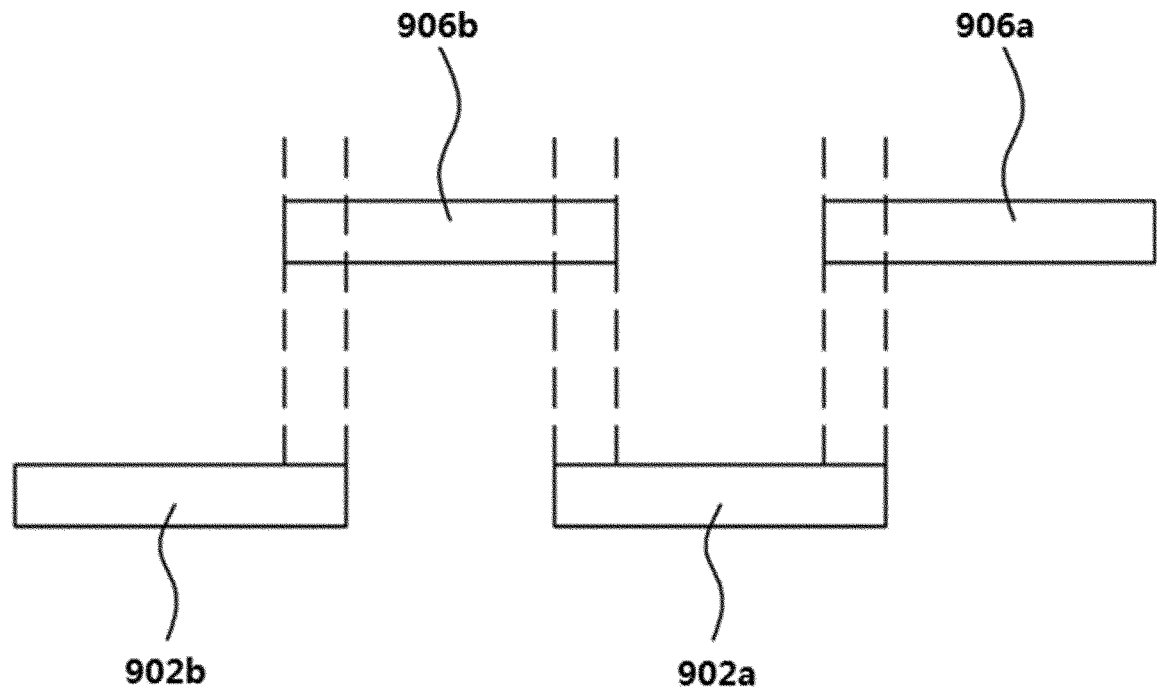
FIG. 10 is a sectional view illustrating array of electrodes according to an embodiment of the present disclosure.
Figure 11:
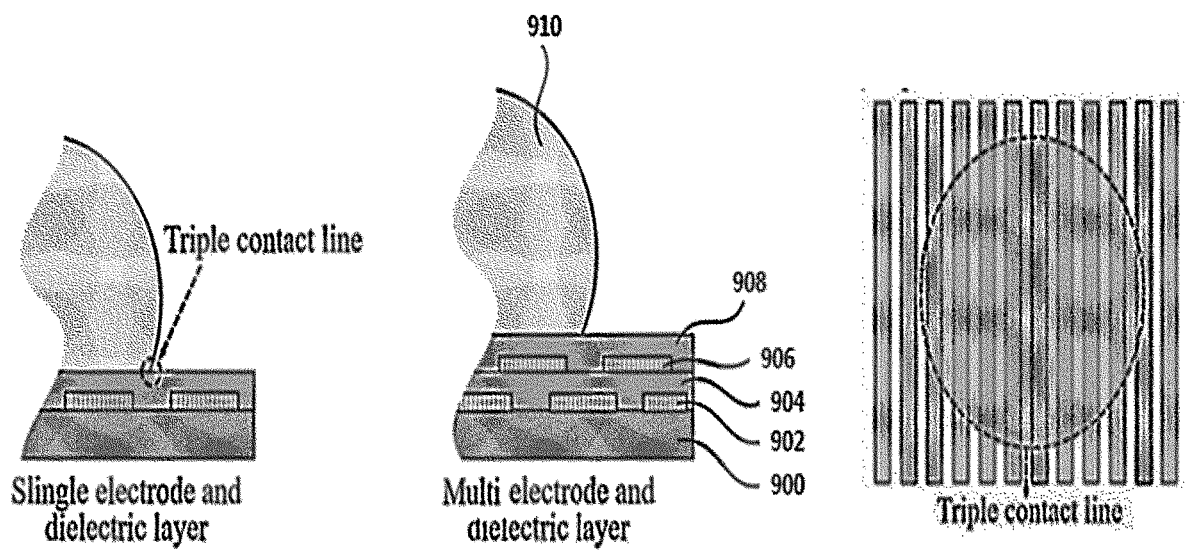
FIG. 11 is a view for describing a triple contact line.
Figure 12:
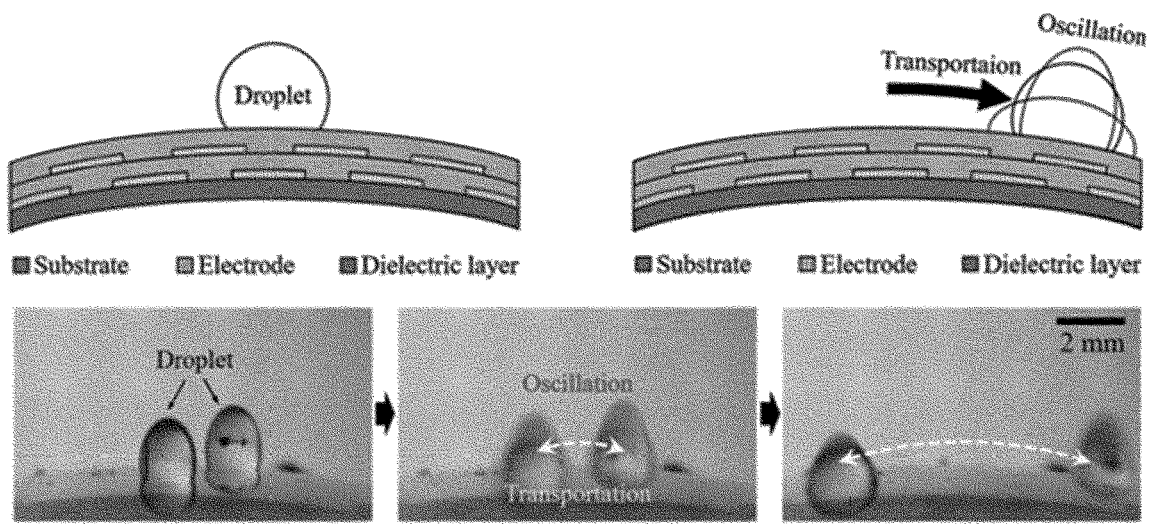
FIG. 12 is a view illustrating a process of removing the droplet.
Figure 13:
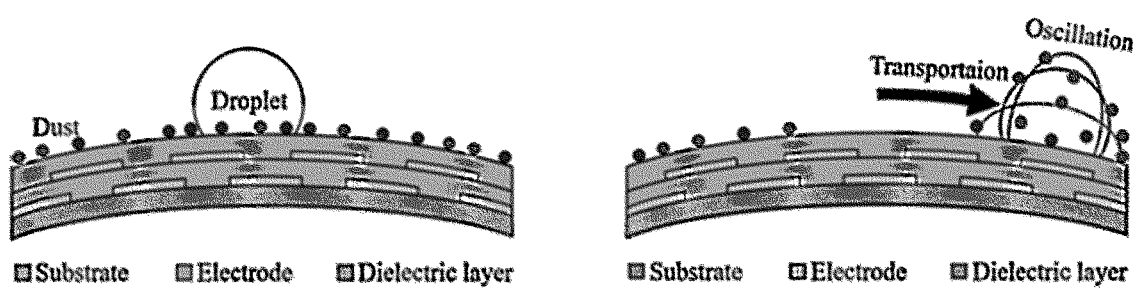
FIG. 13 is a view illustrating a process of removing a dust.
Figure 14:
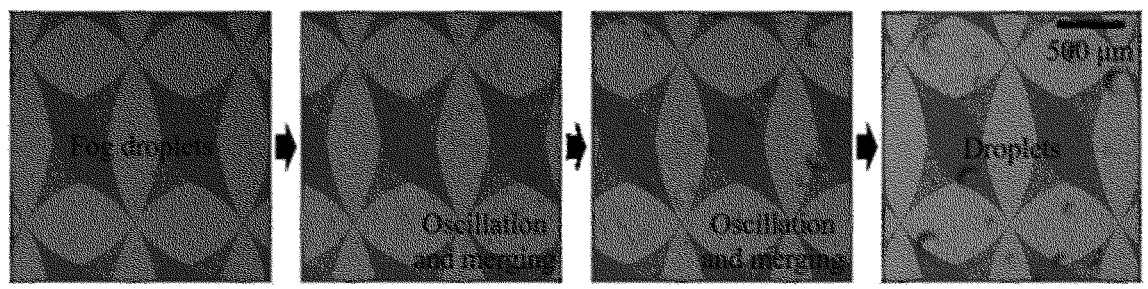
FIG. 14 is a view illustrating a process of removing small scale droplet.

FIG. 9 is a sectional view illustrating a self-cleaning device according to a second embodiment of the present disclosure, FIG. 10 is a sectional view illustrating array of electrodes according to an embodiment of the present disclosure, and FIG. 11 is a view for describing a triple contact line. FIG. 12 is a view illustrating a process of removing the droplet, FIG. 13 is a view illustrating a process of removing a dust, and FIG. 14 is a view illustrating a process of removing small scale droplet.

In FIG. 9, the self-cleaning device of the present embodiment may have a multi-layer structure. FIG. 9 shows two layers, but the self-cleaning device may have three or more layers. It is assumed that the self-cleaning device has two layers for convenience of description.

The self-cleaning device may include a solid material layer 900, a first layer having first electrodes 902 and a first dielectric layer 904 and a second layer having second electrodes 906 and a second dielectric layer 908. Of course, a hydrophobic layer (not shown in FIG. 9) may locate on the second dielectric layer 908.

The first electrodes 902 may be disposed with a certain gap on the solid material layer 900.

In an embodiment, a part of the first electrodes 902 may operate as an electrode to which a positive voltage is applied, and the other first electrode may operate as an electrode to which a ground voltage is applied. The first electrode to which the positive voltage is applied and the first electrode to which the negative voltage is applied may be alternately arrayed.

The first dielectric layer 904 may be formed on the first electrodes 902 and cover the first electrodes 902.

The second electrodes 906 may be disposed with a certain gap on the first dielectric layer 904. Here, the gap may be identical to or different from a space between the first electrodes 902.

In an embodiment, a part of the second electrodes 906 may operate as an electrode to which a positive voltage is applied, and the other second electrode may operate as an electrode to which a ground voltage is applied. The second electrode to which the positive voltage is applied and the second electrode to which the negative voltage is applied may be alternately arrayed.

The second electrodes 906 may be separated from the first electrodes 902 and the second electrodes 906 and the first electrodes 902 may be disposed in parallel. For example, the first electrodes 902 and the second electrodes 906 may be disposed in a horizontal direction of the self-cleaning device.

In another embodiment, the second electrodes 906 may cross over the first electrodes 902, for example the first electrodes 902 and the second electrodes 906 may be disposed in cross. For example, the first electrodes 902 may be disposed in a horizontal direction of the self-cleaning device, and the second electrodes 906 may be disposed in a vertical direction of the self-cleaning device.

Of course, two layers are shown in FIG. 9, but electrode array of respective layers may be more variously designed when three or more layers exist. In this case, electrodes in two layers are disposed in parallel or cross each other.

The second dielectric layer 908 may be formed on the second electrodes 906 and cover the second electrodes 906.

Briefly, the self-cleaning device may comprise multiple layers, each of the multiple layers including the electrode and the dielectric layer. Meanwhile, the self-cleaning device may have a plane structure as shown in FIG. 9, or have a flexible structure as shown in FIG. 12. For example, the solid material layer 900 is made up of flexible material.

Hereinafter, array and effect of the electrodes 902 and 906 in the multi-layered structure will be described in detail.

In FIG. 10, first electrodes 902a and 902b may be disposed in a certain gap, and second electrodes 906a and 906b may be disposed in a specific gap. Here, a positive voltage is applied to the first electrode 902a, a ground voltage is applied to the first electrode 902b, a positive voltage is applied to the second electrode 906a, and a ground voltage is applied to the second electrode 906b.

In an embodiment, at least partial of the first electrodes 902 and the second electrodes 906 may be overlapped as shown in FIG. 10. For example, a right end part of the first electrode 902a may be overlapped with a left end part of the second electrode 906a, a left end part of the first electrode 902a may be overlapped with a right end part of the second electrode 906b, a right end part of the first electrode 902b may be overlapped with a left end part of the second electrode 906b. Of course, array of the first electrodes 902 and the second electrodes 906 may be expanded in a unit of the array shown in FIG. 10.

In another view, the first electrodes 902 may be disposed between the second electrodes 906. As a result, the electrodes 902 and 906 may be disposed without empty space in the self-cleaning device.

Hereinafter, effect of the cleaning device when the electrodes 902 and 906 are disposed will be described.

Referring to FIG. 11, a triple contact line corresponding to an interface at which a droplet 910 is contact with the surface of the cleaning device exists. An electrode may not be disposed just under the triple contact line as shown in a left drawing of FIG. 11 in a self-cleaning device having a single layer, but the electrode may be disposed just under the triple contact line in the self-cleaning device with the multi-layered structure. Accordingly, since electric field generated by the electrode affects directly to the droplet 910 corresponding to the triple contact line, droplet removal effect in the self-cleaning device having the multi-layered structure may be considerably higher than that in the self-cleaning device with the single-layered structure.

Every applying method (direct current applying method, alternating current applying method, alternative applying method of the low frequency voltage and the high frequency voltage and so on) in above embodiments may be applied to the self-cleaning device having the multi-layered structure.

For example, in the event that the droplet 910 oscillates by applying the alternating current voltage to the electrodes 902 and 906, the droplets and dust may be removed after moved as shown in FIG. 12 and FIG. 13, and micro droplets may be smoothly removed as shown in FIG. 14. Specially, every of conductive droplets and nonconductive droplets may be removed when the alternating current voltage is applied to the electrodes 902 and 906 via the on/off switching method.

In an embodiment, a power applying method to the first electrodes 902 may be different from a power applying method to the second electrodes 906.

For example, an alternating current voltage applied to the first electrodes 902 may be higher than that applied to the second electrodes 906.

For another example, the same alternating current voltage is applied to the electrodes 902 and 906, a frequency of the alternating current voltage applied to the first electrodes 902 being different from that applied to the second electrodes 906.

The self-cleaning device may merge the droplets by applying respectively alternating current voltages to the first electrodes 902 and the second electrodes 906 and remove the merged droplets by generating the mechanical oscillation. Here, intensity of the alternating current voltage applied to the first electrodes 902 may be different from that of the alternating current voltage applied to the second electrodes 906.

In another embodiment, the self-cleaning device may merge the droplets by applying the alternating current voltage to only one electrodes of the first electrodes 902 and the second electrodes 906 and remove the merged droplets by generating the mechanical oscillation.

Figure 15:
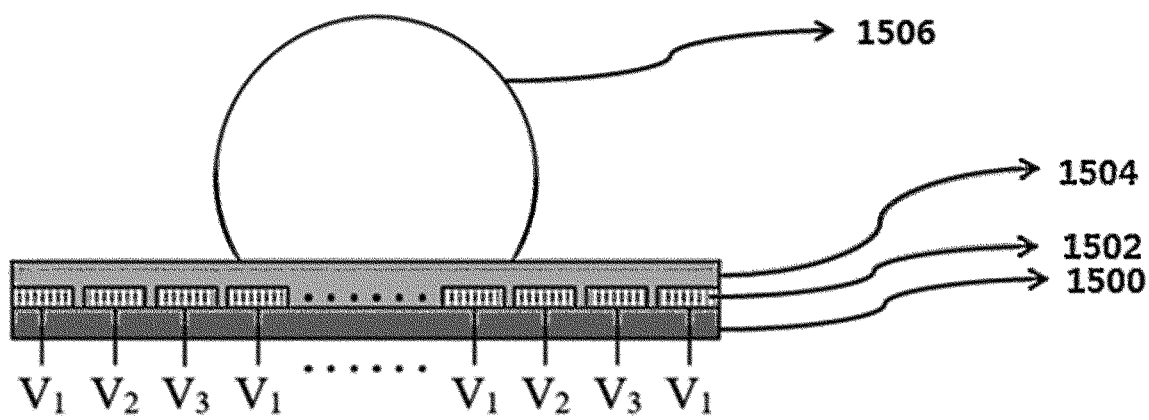
FIG. 15 is a sectional view illustrating a self-cleaning device according to a third embodiment of the present disclosure.
Figure 16:
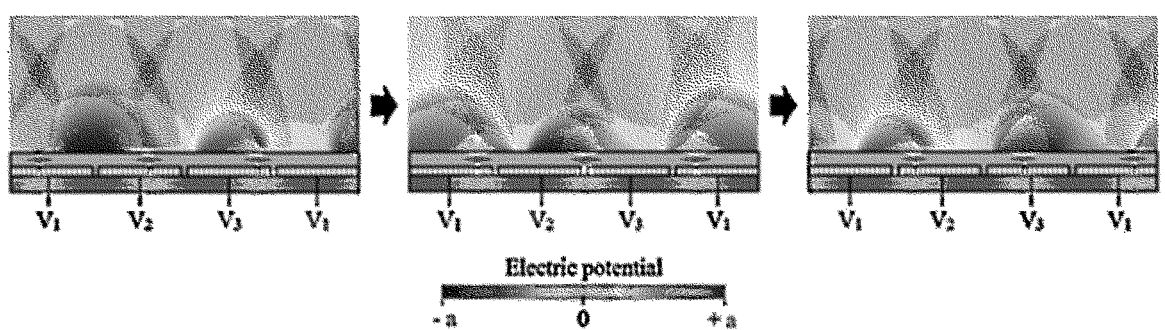
FIG. 16 is a view illustrating an electric field distribution according to an embodiment of the present disclosure.
Figure 17:
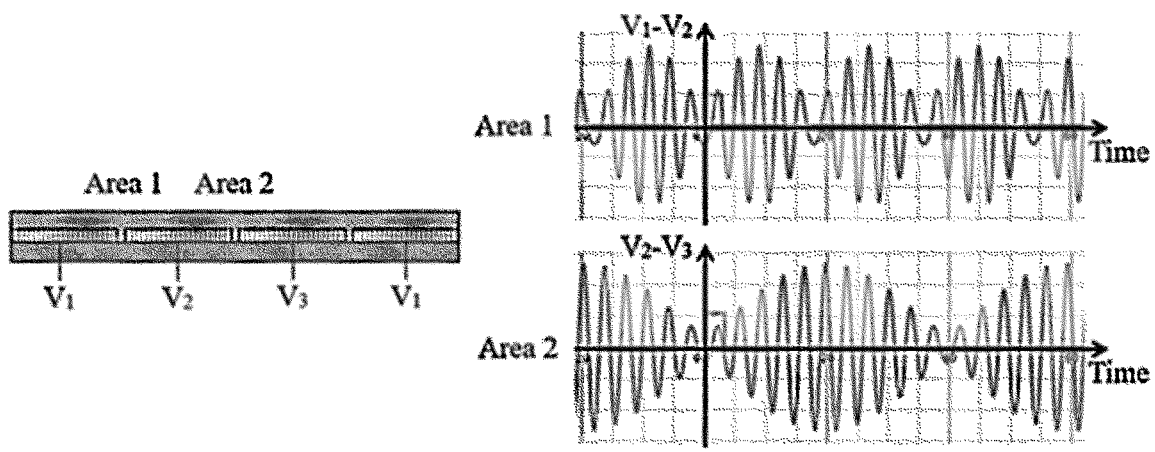
FIG. 17 is a view illustrating a potential difference for each location/each time when three electric signals are applied to electrodes according to an embodiment of the present disclosure.
Figure 18:
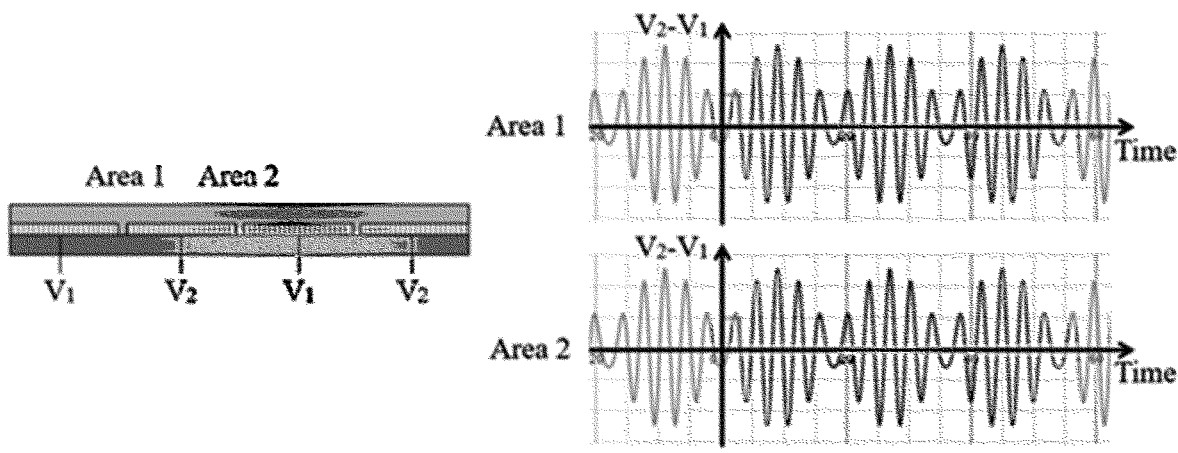
FIG. 18 is a view illustrating a potential difference for each location/each time when two electric signals are applied to the electrodes.
Figure 19:
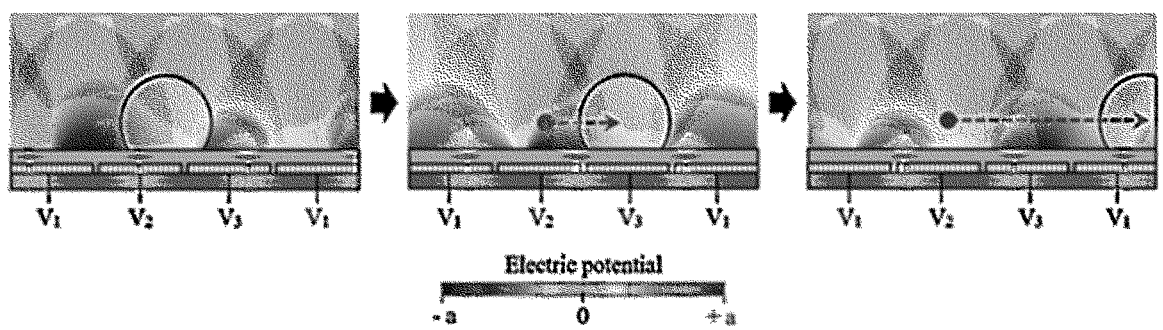
FIG. 19 is a view illustrating a moving of the droplet based on the electric field distribution according to an embodiment of the present disclosure.

FIG. 15 is a sectional view illustrating a self-cleaning device according to a third embodiment of the present disclosure, FIG. 16 is a view illustrating an electric field distribution according to an embodiment of the present disclosure, and FIG. 17 is a view illustrating a potential difference for each location/each time when three electric signals are applied to electrodes according to an embodiment of the present disclosure. FIG. 18 is a view illustrating a potential difference for each location/each time when two electric signals are applied to the electrodes, and FIG. 19 is a view illustrating a moving of the droplet based on the electric field distribution according to an embodiment of the present disclosure.

In FIG. 15, the self-cleaning device of the present embodiment may include a substrate 1500, electrodes 1502 and a dielectric layer 1504 disposed in sequence. Of course, a hydrophobic layer may be formed on the dielectric layer 1504 and a droplet 1506 may locate on the hydrophobic layer.

In an embodiment, three or more electric signals (alternating current voltage) may be simultaneously applied to the electrodes 1502, and thus the droplet 1506 vibrates and an adhesive power between the droplet 1506 and a surface of the self-cleaning device reduces. Here, at least one of phase, amplitude and a frequency of the electric signals may differ. That is, the self-cleaning device may apply three types of electric signals of which the phase, the amplitude or the frequency differs to the electrodes 1502.

For example, as shown in FIG. 15, a first electric signal (first alternating current voltage, V1) may be applied to first electrodes, a second electric signal (second alternating current voltage, V2) is applied to second electrodes, and a third electric signal (third alternating current voltage, V3) may be applied to third electrodes. Here, the first electrode, the second electrode and the third electrode may be sequentially disposed, and a structure of the electrodes disposed sequentially may be repeatedly formed.

Electric field distribution that areas of comparatively strong electric field are shifted in a specific direction (for example, a direction of gravity) or are sequentially shown in the specific direction may be formed when the electric signals are applied.

The droplet 1506 moves to the area of strong electric field by the principle of electrowetting-on-dielectric as shown in FIG. 19, and thus the electric field distribution may oscillate the droplet 1506 and move the droplet 1506 in the specific direction, e.g., merge and move the droplets 1506. As a result, the droplet 1506 may be more efficiently removed and dependency about gravity for removal of the droplet 1506 may be lowered.

Particularly, the droplet 1506 oscillates when the electric signal is applied to the electrodes of the self-cleaning device while a glass, etc., to which the self-cleaning device is adhered is inclined, and adhesive power between the droplet 1506 and a surface of the self-cleaning device reduces in response to the oscillation, and thus the droplet 1506 move in a direction of gravity to be removed.

The droplets 1506 are better merged and moved in the direction of gravity by the electric field distribution when three types of electric signals are applied to the electrodes 1502. That is, the self-cleaning device of the present embodiment may better move in the direction of gravity to remove the droplets 1506 compared to in other embodiments, under the condition of the same slope of the surface of the self-cleaning device.

The self-cleaning device of the present embodiment may better move the droplet 1506 in the direction of gravity to remove the droplet 1506 under the condition of comparatively small slope of the surface of the self-cleaning device. That is, dependency about the gravity for removal of the droplet 1506 may reduce.

Additionally, the self-cleaning device may move the droplet 1506 in the specific direction to remove the droplet 1506 by applying the electric signal though the surface of the self-cleaning device is not inclined.

That is, the self-cleaning device of the present disclosure can remove the droplet 1506 irrespective of the inclination of its surface.

The potential difference is identical for each location/each time as shown in FIG. 18 when different two or less electric signal is applied to the electrodes 1502. As a result, electric field distribution that areas of strong electric field are shifted in a specific direction or are sequentially shown in the specific direction is not generated. Accordingly, dependency about the gravity does not reduce.

The potential difference is continuously changed for each location/each time as shown in FIG. 17 when three or more different electric signals are applied to the electrodes 1502. As a result, the electric field distribution that areas of strong electric field are shifted in a specific direction or are sequentially shown in the specific direction is generated, and so the dependency about the gravity may reduce. Specially, the self-cleaning device may more efficiently remove the droplet 1506 if the electric signals are designed so that the areas of strong electric field are sequentially formed in the direction of gravity through preliminary experiment.

Briefly, the self-cleaning device of the present embodiment may more efficiently remove the droplet 1506 by applying different three or more electric signals to the electrodes 1502.

The self-cleaning device may better merge the droplets by applying different three or more electric signals to the electrodes 1502 and remove the merged droplets by generating the mechanical oscillation.

On the other hand, three or more electric signals are regularly applied to the electrodes 1502 in above description, but they may be irregularly applied.

Figure 20:
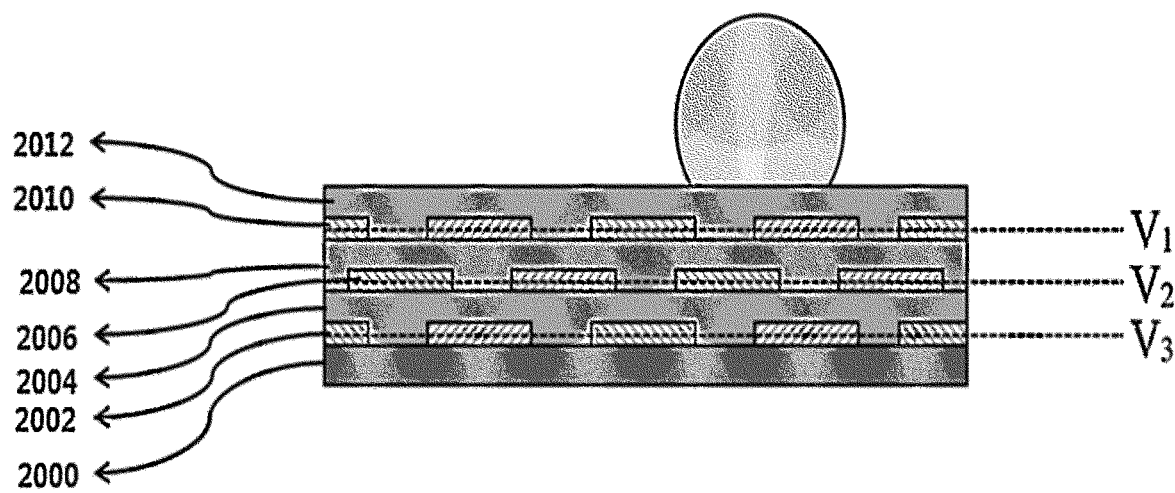
FIG. 20 is a view illustrating a self-cleaning device having a three-layered structure according to a fourth embodiment of the present disclosure.
Figure 21:
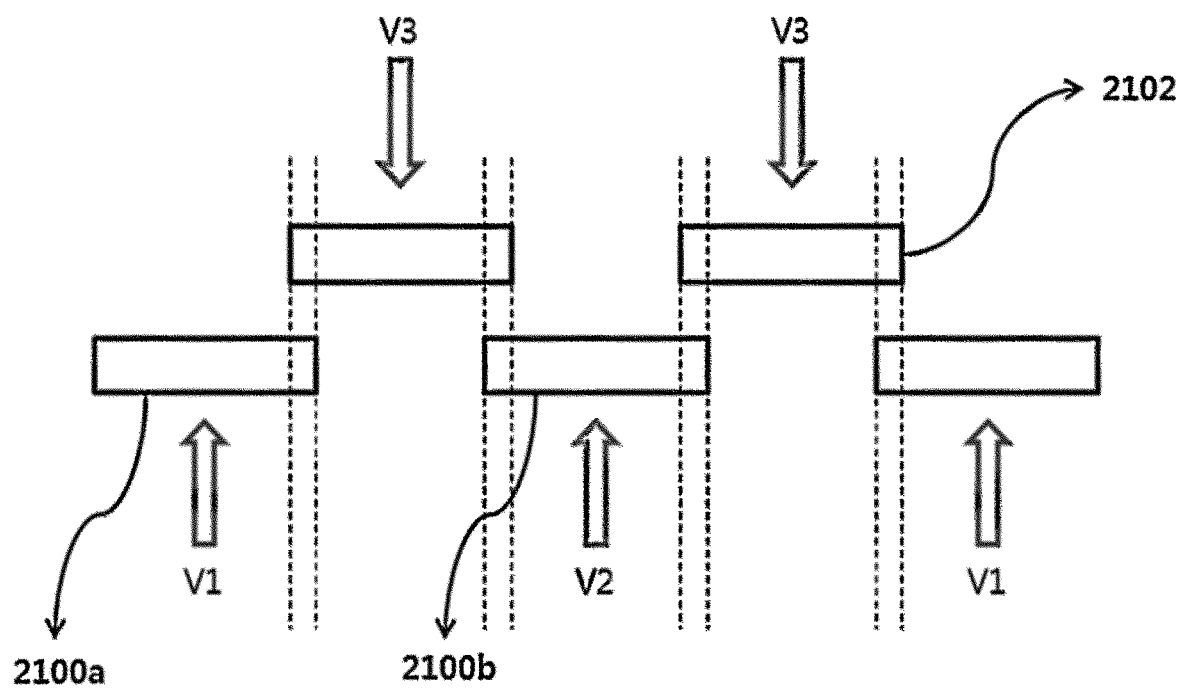
FIG. 21 is a view illustrating schematically a multi-layered self-cleaning device according to still another embodiment of the present disclosure.
Figure 22:
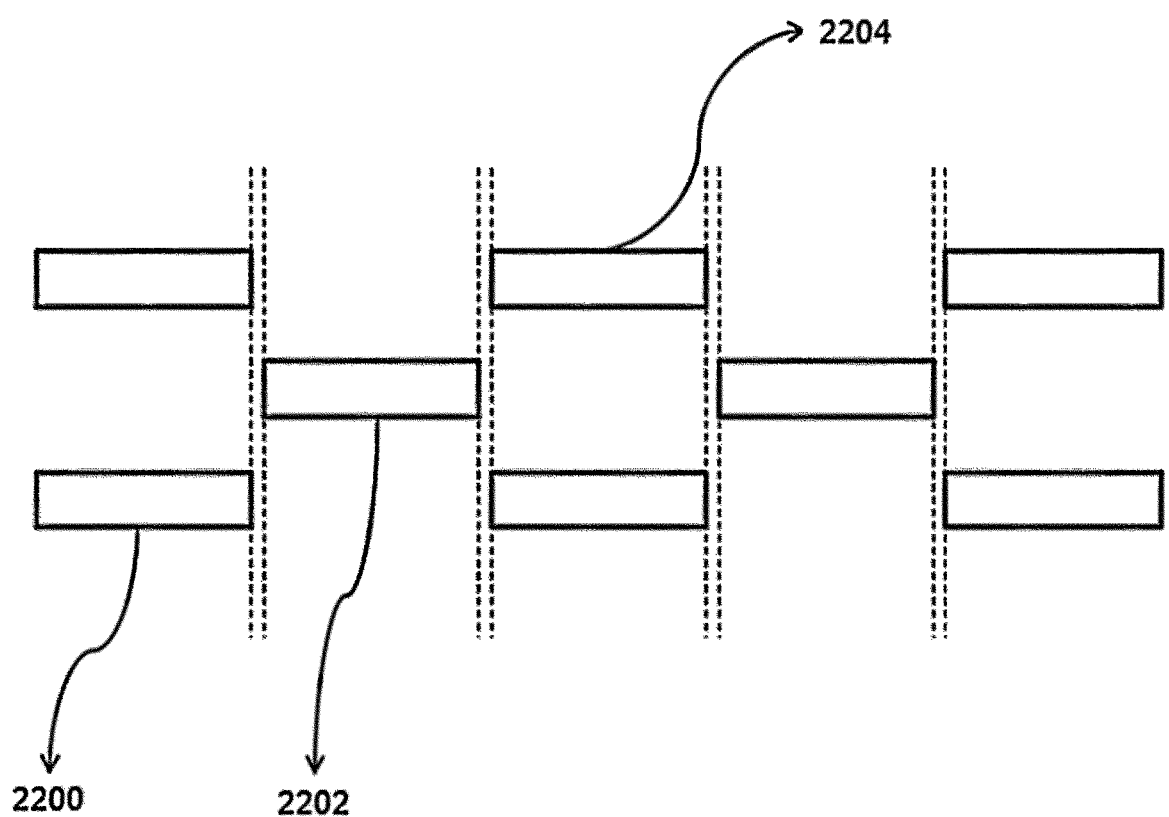
FIG. 22 is a view illustrating schematically a multi-layered self-cleaning device according to still another embodiment of the present disclosure.

FIG. 20 is a view illustrating a self-cleaning device having a three-layered structure according to a fourth embodiment of the present disclosure, FIG. 21 is a view illustrating schematically a multi-layered self-cleaning device according to still another embodiment of the present disclosure, and FIG. 22 is a view illustrating schematically a multi-layered self-cleaning device according to still another embodiment of the present disclosure.

In FIG. 20, the self-cleaning device of the present embodiment may have a multi-layered structure and include a substrate 2000, a first electrode 2002, a first dielectric layer 2004, a second electrode 2006, a second dielectric layer 2008, a third electrode 2010, a third dielectric layer 2012 and a hydrophobic layer (not shown). The droplet locates on the hydrophobic layer.

The second electrode 2006 is disposed between the first electrodes 2002, wherein at least partial of the first electrodes 2002 and corresponding second electrode 2006 may be overlapped. The third electrode 2010 is disposed between the second electrodes 2006, wherein at least partial of the second electrodes 2006 and the third electrode 2010 may be overlapped.

In the multi-layered structure, a third electric signal V3 may be applied to the first electrodes 2002, a second electric signal V2 may be applied to the second electrodes 2006, and a first electric signal V1 may be applied to the third electrodes 2010. Here, phase, amplitude or a frequency of the electric signals V1, V2 and V3 differ.

As a result, the electric field distribution that areas of strong electric field are shifted in a specific direction or are sequentially shown in the specific direction is generated, thereby removing more efficiently the droplets.

In another embodiment, first electrodes 2100 and second electrodes 2102 have a multi-layered structure as shown in FIG. 21. Here, different two electrical signals V1 and V2 may be applied to the first electrodes 2100 and an electric signal V3 different from the two electrical signals may be applied to the second electrodes 2102. That is, different electric signals V1 and V2 may be applied to the first electrodes 2100 in the same layer. For example, the first electric signal V1 may be applied to a 1-1 electrode 2100a of the first electrodes 2100 and a second electric signal V2 different from the first electric signal V1 may be applied to a 1-2 electrode 2100b of the first electrodes 2100, the 1-1 electrode 2100a and the 1-2 electrode 2100 being alternatively disposed.

In still another embodiment, first electrodes 2200, second electrodes 2202 and third electrodes 2204 form a multi-layered structure as shown in FIG. 22, wherein three or more electric signals may be applied to the electrodes 2200, 2202 and 2204.

Unlike FIG. 20 and FIG. 21, the second electrode 2202 is disposed between the first electrodes 2200 and the second electrode 2202 and the first electrodes 2200 may not be overlapped in FIG. 22. Furthermore, the third electrode 2204 is disposed between the second electrodes 2202 and the third electrode 2204 and the second electrodes 2202 may not be overlapped.

A space a between the electrodes in the multi-layered structure may be considerably smaller than that in a single-layered structure. It should maintain widely the space between the electrodes to prevent a short between the electrodes, in the single-layered structure. Whereas, the electrodes are disposed in different layers in the multi-layered structure, and thus a short between the electrodes may not occur rarely. As a result, the space between the electrodes in the multi-layered structure may be smaller than in the single-layered structure. That is, the space between the electrodes may be minimized, and so more excellent removal efficiency of the droplet may be achieved compared to the single-layered structure.

Shortly, in the self-cleaning device with the multi-layered structure, three or more different electric signals may be variously applied to the electrodes, and the array of the electrodes in the layers and the electric field distribution may be variously designed.

In above description, three electric signals are applied to the electrodes. However, four or more electric signals may be applied to the electrodes.

The method of applying the voltage to the electrodes is mentioned in above description, but the self-cleaning device may remove frost formed on its surface by applying current to the electrodes to generate a resistance heating.

Components in the embodiments described above can be easily understood from the perspective of processes. That is, each component can also be understood as an individual process. Likewise, processes in the embodiments described above can be easily understood from the perspective of components.

The embodiments of the invention described above are disclosed only for illustrative purposes. A person having ordinary skill in the art would be able to make various modifications, alterations, and additions without departing from the spirit and scope of the invention, but it is to be appreciated that such modifications, alterations, and additions are encompassed by the scope of claims set forth below.

What is claimed is:

1. A self-cleaning device comprising:
   at least one first electrode disposed on a solid material layer;
   a first dielectric layer disposed on the at least one first electrode;
   a hydrophobic layer disposed on the first dielectric layer;
   at least one mechanical oscillation unit; and
   a controller,
   wherein electrical oscillation for oscillating a droplet in a horizontal direction is generated by applying a first electric signal to the at least one first electrode, thereby merging droplets formed on the hydrophobic layer,
   the mechanical oscillation unit moves the merged droplets in a specific direction or atomizes the merged droplets to remove the merged droplets by generating mechanical oscillation for oscillating the droplets in a vertical direction,
   each of the droplets has a volume smaller than 3 µl, a new droplet having a volume more than 3 µl is generated by the merging, and the mechanical oscillation unit is not activated when the electrical oscillation is generated to merge the droplets but is activated after the droplets are merged,
   the controller controls to generate selectively the electrical oscillation or the mechanical oscillation, and to generate the mechanical oscillation after the electrical oscillation is generated according to a situation of the droplets formed on the hydrophobic layer.

2. The self-cleaning device of claim 1, wherein the generated new droplet moves in the specific direction or is atomized by the mechanical oscillation when the generated new droplet has a volume corresponding to a resonance frequency of the mechanical oscillation unit.

3. The self-cleaning device of claim 1, wherein the mechanical oscillation unit is a sound wave generator for generating single sound wave or multiple sound waves, the first electric signal is an alternating current voltage, and the sound wave generator is disposed below the solid material layer.

4. The self-cleaning device of claim 1, wherein the self-cleaning device is formed on a glass of a camera, a cover glass of an optical sensor, an automobile glass, a mirror or a glass of a building.

5. The self-cleaning device of claim 1, wherein the droplets and a solid pollutant are removed from the self-cleaning device.

* * * * *